Figure 1:
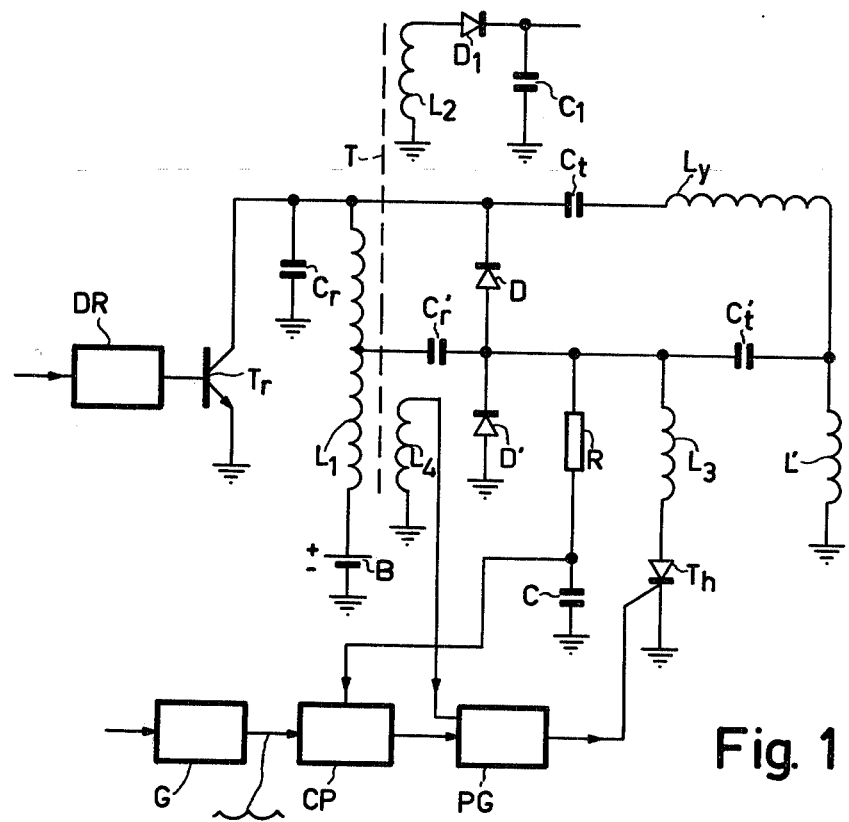

United States Patent [19]

Boekhorst

[11] 4,182,978
[45] Jan. 8, 1980

[54] CIRCUIT FOR GENERATING A SAWTOOTH LINE DEFLECTION CURRENT

[75] Inventor: Antonius Boekhorst, Eindhoven, Netherlands

[73] Assignee: U.S. Philips Corporation, New York, N.Y.

[21] Appl. No.: 896,498

[22] Filed: Apr. 17, 1978

[30] Foreign Application Priority Data

May 2, 1977 [NL] Netherlands ............... 7704771

[51] Int. Cl.² .................................. H01J 29/56
[52] U.S. Cl. .................................. 315/371; 315/408
[58] Field of Search ............... 315/399, 407, 408, 410, 315/371

[56] References Cited
U.S. PATENT DOCUMENTS 4,122,363  12/1978  Zappala et al. ............... 315/408

Primary Examiner—Theodore M. Blum
Attorney, Agent, or Firm—Thomas A. Briody; William J. Streeter; Edward W. Goodman

[57] ABSTRACT

A line deflection current generator and a diode modulator for influencing the amplitude of the generated deflection current but without influencing the d.c. voltages which are also generated by the generator, a controllable switching device, for example, the series arrangement of a coil and a thyristor being included in parallel with one of the diodes of the diode modulator and with the opposite direction of conduction. This controllable switching device can also serve as control element for the amplitude modulation.

7 Claims, 3 Drawing Figures

CIRCUIT FOR GENERATING A SAWTOOTH LINE DEFLECTION CURRENT

The invention relates to a circuit for generating a sawtooth line deflection current having a trace and a retrace through a line deflection coil, comprising a controllable switch which is cut off during the retrace, and a diode modulator for influencing the amplitude of the generated deflection current during the trace period as a function of a modulation signal, whilst one or more d.c. voltage(s) likewise generated by the circuit is (are) not influenced, this diode modulator comprising a first diode, which co-operates with the deflection coil, and a second diode essentially in parallel with a modulator coil.

In order to correct the distortion in the horizontal direction, the so-called East-West distortion, of the picture displayed on the screen of the picture display tube in a television receiver, the amplitude of the line deflection current is modulated at field frequency in such a circuit. The d.c. voltages which are also generated by the line deflection current generator are not modulated. One of these d.c. voltages is the high tension for the final anode of the display tube. A plurality of variants of the diode modulator are known.

In the diode modulator described in the publication Philips Application Note 206: "2 OAX for 110° Colour Television, Deflection and power supply circuits," FIG. 5, two series-arranged diodes are kept in the conducting state during the trace period by means of a current flowing through a load, whereas they are cut off during the retrace period. They thus form a switch which conducts in either direction during the trace period. However, the load may create a high dissipation.

In a further type which is described in U.S. Pat. No. 3,906,305 use is made of the parallel diode of the line deflection current generator, which parallel diode is replaced by two series-arranged diodes. Herein a load is not required and even impossible.

As known a first trace capacitor, i.e., the trace capacitor which is in series with the deflection coil is given such a capacitance that the so-called S-correction can take place. It is, however, known from, for example, the publication "Philips Application Information No. 268: All Transistor 110° Colour Television" that the linearity of the line deflection can be improved by applying a greater depth of modulation for the S-correction than for the deflection current itself. In certain circumstances this measure results in that the current through the second diode becomes zero during the first half of the trace period when the controllable switch does not conduct, for example, because the conduction time thereof is controlled for stabilisation purposes and, consequently, varies from line to line. To avoid this effect, which results in a serious linearity error of the deflection current, it was proposed in said patent specification to connect the network formed by the first trace capacitor and the deflection coil to a point of the modulator coil which is implemented as an auto-transformer, so that the current supply to the junction of the diode can be reduced. This measure can also be applied for the diode modulator of the first-mentioned type. It has, however, the drawback that the transformer is an expensive component part.

It is an object of the invention to provide a diode modulator without said transformer and without additional dissipation, whereas said linearity error of the deflection current does not occur. To this end the circuit according to the invention is characterized in that a controllable switching device conductive in a first portion of the trace period of the deflection current is arranged in parallel with the second diode with the opposite direction of conduction thereto.

Owing to the measure according to the invention the transformer can be constructed as an inductance. It is a further recognition of the invention that the switching device which is in parallel with the second diode can also be used for effecting the East-West modulation. To this end the circuit according to the invention is characterized in that the controllable switching device conducts from a switching-on instant located between the central instant of the retrace period of the deflection current and the final instant thereof, which switching-on instant is adjustable as a function of the modulation signal. Due to this measure a high-value inductance can be dispensed with. This makes the control circuit of the diode modulator indeed slightly more elaborate but the additional cost thereof, especially when it is integrated in a semiconductor body, is much lower than the price of the inductance.

It will be noted that the diode modulator can also be used for other purposes than the East-West correction, which becomes evident from said United States patent specification, so that the use of the circuit according to the invention need not be limited thereto.

Figure 3:
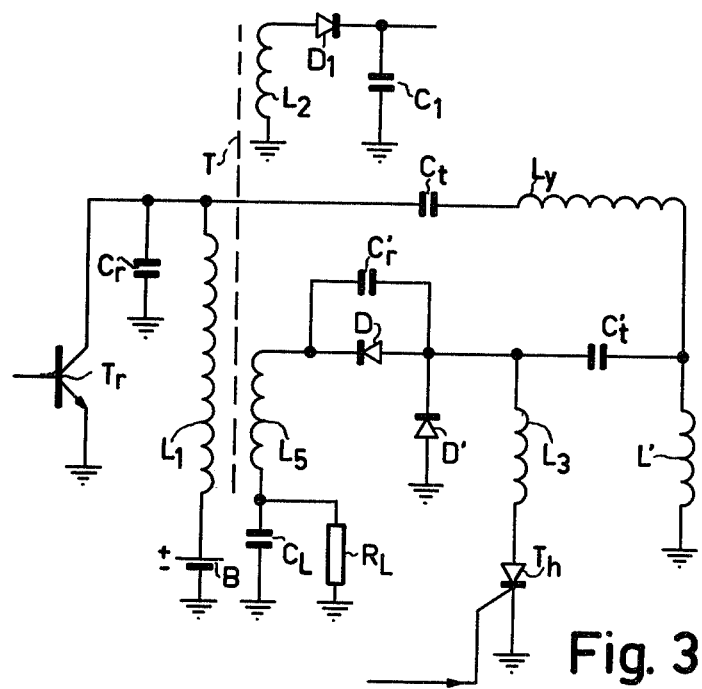
Figure 2:
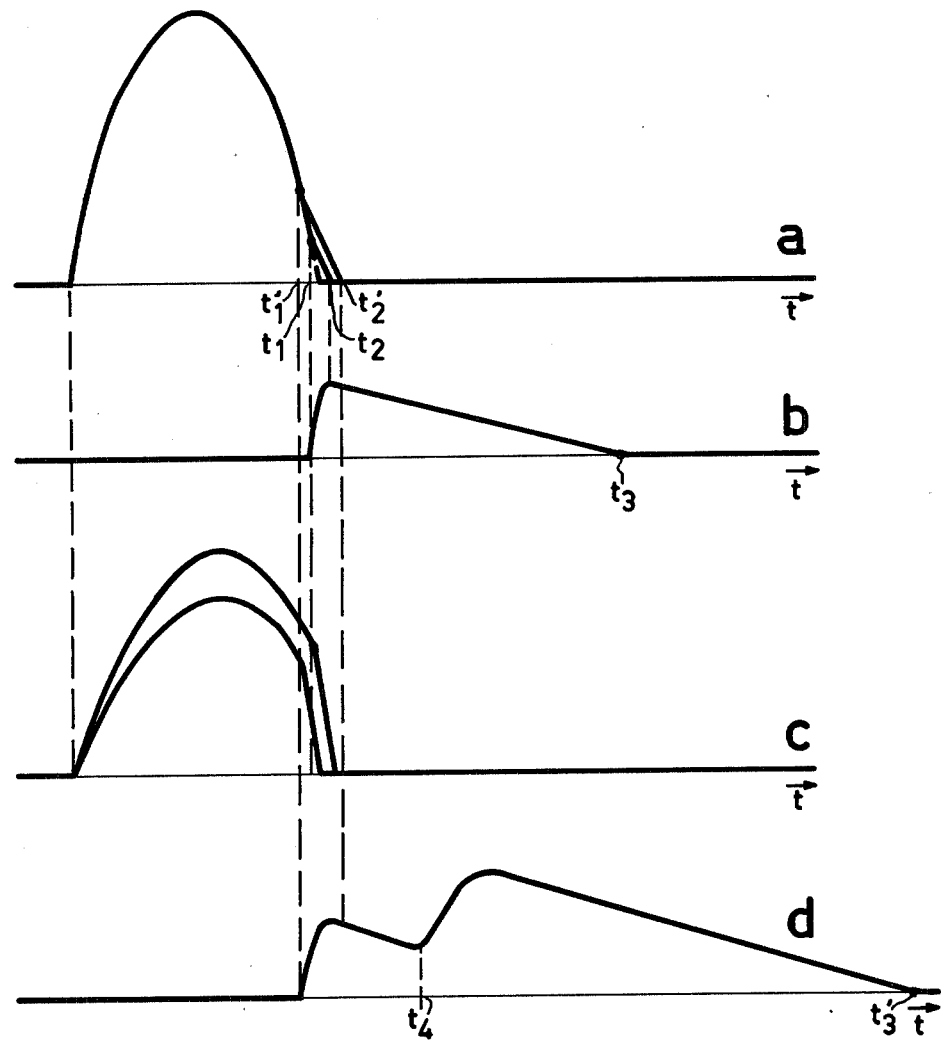

The invention will now be explained in greater detail by way of non-limitative example with reference to the accompanying figures wherein FIG. 1 shows a first embodiment of the circuit according to the invention, FIG. 2 shows waveforms occurring therein and FIG. 3 shows a second embodiment of the circuit according to the invention.

FIG. 1 represents a circuit in a colour television receiver which, except for some details yet to be discussed, has already been described in above-mentioned U.S. Pat. No. 3,906,305, and in particular with reference to FIG. 7 thereof. This patent specification is incorporated by reference herein. In FIG. 1 DR is a driver stage which is supplied with control signals of line frequency, whereas Tr is a switching transistor. $L_1$ is the primary winding of a transformer, $L_2$ is a secondary winding thereof. The pulses present across winding $L_2$ are converted by means of a rectifier $D_1$ and a capacitance $C_1$ into a d.c. voltage, for example the high tension for the final anode of a picture display tube (not shown). In the same manner other d.c. voltages can be generated for supplying other portions of the receiver.

B is a supply voltage source whereas $L_y$ is the line deflection coil. In parallel with the collector-emitter path of transistor Tr there are, respectively, the series arrangement of winding $L_1$ and source B, a retrace capacitor $C_r$, the series arrangement of two diodes D and D' and the series network formed by a trace capacitor $C_t$, coil $L_y$ and a modulator coil L'. Arranged between a tap of winding $L_1$ and the junction of diodes D and D' there is a second retrace capacitor $C'_r$ and between said junction and that of coils $L_y$ and L' there is a second trace capacitor $C'_t$. A variation of field frequency is introduced at the junction of diodes D and D' in a manner which will be explained further on, which subjects the line deflection current flowing through the deflection coil $L_y$ to an amplitude modulation for the correction of the East-West distortion whereas the generated d.c. voltages are not affected by this modulation. To this end a predetermined inductance value is chosen for coil L', whereas the capacitances of capacitors $C_r$, $C'_r$, $C_t$ and $C'_t$ as well as the location of the tap of winding $L_1$ are chosen in a suitable manner. These choices imply that the sawtooth currents of line frequency flowing through coils $L_y$ and L' have retrace periods of always approximately the same duration and that the deflection current through coil $L_y$ is S-corrected, the depth of the field frequency modulation applied to the S-correction being greater than that applied to the deflection current itself.

Without a control at field frequency a voltage $(-L'/L' + L_y) \cdot V_b$ is present across coil L' during the trace period. In this expression L' and $L_y$ are the inductance values of coil L' and $L_y$, respectively, whereas $V_b$ is the voltage of source B. A positive voltage pulse, whose amplitude is proportional to the trace voltage, is present across coil L' during the retrace period. The equilibrium state is obtained if voltage pulses of equal amplitude occur on either side of capacitor $C'_r$ which indicates that the values of the said components as well as the location of the tap have been chosen in the correct manner. Because capacitor $C'_t$ has a rather high capacitance, the voltage pulses on either side of capacitor $C'_r$ are also present at the junction of coils $L_y$ and L' and are to be subtracted from the pulses which can become available at coil $L_y$.

In the prior art circuit the control at field frequency is effected by disturbing this equilibrium, namely by forcing upon coil L' a trace voltage which is below the above-mentioned value. To this end the average voltage at the junction of diodes D and D' is reduced by means of a load which varies at field frequency and is connected to said point through an inductance of a high value. If the modulated S-correction has a high value it may happen that the current through diode D' and components $C'_t$ and L' become negative during the first half of the trace period. Consequently diode D' becomes cut off. If at this instant transistor Tr is already conducting then the current through $C'_t$ and L' can yet find a way, namely through diode D, which is kept in the conducting state by the deflection current, and through transistor Tr. However, it may happen that the transistor has not yet been made conductive, for example because the conduction time thereof varies from line to line for stabilisation purposes, so that also this current path is blocked. In these circumstances the voltage across coil L' increases, which reduces the trace voltage of coil $L_y$ correspondingly and which results in a serious linearity error of the deflection current.

To prevent this effect said patent specification proposes to connect the series network $C_t$, $L_y$ to a tap of coil L' instead of to the junction of components $C'_t$ and L'. Coil L' is thus constructed as an auto-transformer, or as a transformer if a d.c. isolation is desired. This measure increases the current through diode D' during the first half of the trace period.

In accordance with the invention a thyristor $T_h$ is used whose anode is connected through a small inductance $L_3$ to the cathode of diode D' and whose cathode is connected to ground. Thyristor $T_h$ is a controllable switch which, via inductance $L_3$, is in parallel with the diode D' with the opposite conduction direction so that the thyristor and the diode together constitute a switch which conducts in either direction. If it is ensured that thyristor $T_h$ conducts during the period of time wherein the current through coil L' reverses so that diode D' is cutoff, i.e at the beginning of the trace period and before the central instant thereof, then this current can flow through the thyristor, irrespective of the fact whether transistor Tr conducts or not.

Because of this measure the (auto)transformer of the prior art circuit can be replaced by coil L'. Furthermore, thyristor $T_h$ can be used as control element for the modulation at field frequency because the time of conduction thereof can be varied. The load which varies at field frequency as well as the high-value inductance with which the modulation at the junction of the diodes is transferred in the known circuit can be dispensed with. As the trace and the retrace alternate periodically, one energy state passing into the other state with slight losses, it is possible to control the modulator by introducing a disturbance of the equilibrium not during the trace period but during the retrace period. For the circuit according to the invention this can be realized in a simple manner by advancing the switching-on instant of thyristor $T_h$ relative to the end of the retrace period.

A waveform generator G is supplied with signals of field frequency which, for example, may originate from a field deflection current generator and generates in known way a substantially parabolic modulation signal. The signal obtained is applied to a comparison stage CP, the operation of which will be explained hereinafter and whose output signal is applied to a pulse generator PG. Pulse generator PG supplies trigger pulses to the cathode gate of thyristor $T_h$ in dependency on the parabolic signal of field frequency for switching the thyristor on at the proper instant.

During the retrace period both transistor Tr and diodes D and D' are cutoff. A substantially sinusoidal voltage of a high amplitude is present at the collector of transistor Tr (see FIG. 2a). At an instant $t_1$ thyristor $T_h$ is made conducting by a trigger pulse originating from pulse generator PG. The current herein (see FIG. 2b) increases from zero with a substantially sinusoidal variation, which is mainly determined by the capacitance of capacitor $C'_r$ and the value of inductance $L_3$, as well as by the value of the leakage inductance of winding $L_1$. The maximum value attained by this current also depends on the value of the voltage at the cathode of diode D' (see FIG. 2c) at instant $t_1$. Because inductance $L_3$ has a much lower value, i.e. approximately 20 to 30 $\mu$H than coil L' whose value is approximately 350 $\mu$H at a value of coil $L_y$ of approximately 1 mH, the thyristor current varies rather rapidly. This accelerates the discharge of capacitor $C'_r$ whereas the voltage of FIG. 2c decreases rather rapidly.

At instant $t_1$ the voltage of FIG. 2a shows a feeble bend which is caused by the change in the tuning, so that the flyback period is slightly prolonged compared with the case, shown by a dashed line, that thyristor $T_h$ were not switched on. At an instant $t_2$ the voltage of FIG. 2a becomes somewhat negative, so that diodes D and D' conduct. This is the final instant of the flyback period. Because the voltage at the cathode of diode D' remains substantially constant from instant $t_2$, i.e. approximately $-0.7$ V, whereas the voltage at the anode of thyristor $T_h$ is approximately 0.3 V, a decreasing sawtooth current flows through inductance $L_3$ and consequently through thyristor $T_h$, even if no trigger pulse is present anymore at the gate of the thyristor. This current becomes zero at an instant $t_3$ whereafter the thyristor remains in the cutoff state. It appears from the preceding that thyristor $T_h$ carries current during a part of the retrace period at the end thereof and during a part of the trace period at the beginning thereof. The sole condition for the controllability of the thyristor is that the instant $t_3$ at which the current therethrough becomes zero is located before the beginning of the next retrace period. The turn-off time of the thyristor must be taken into account.

During the retrace period inductance $L_3$ stores a certain amount of energy and releases this energy slowly during the trace period until instant $t_3$ so that the value of inductance $L_3$ must be sufficiently low. Inductance $L_3$ also reduces the peak current which would otherwise occur during turn-on of thyristor $T_h$, so that the dissipation is decreased whilst avoiding possible disturbances. It will be clear that thyristor $T_h$ can be replaced by another switching element, for example by a transistor. However, in this case the control electrode thereof, for example the base, must be supplied with a control signal which is sufficiently long to ensure that the transistor remains conducting until instant $t_3$. It will also be clear that inductance $L_3$ is not strictly necessary for a proper operation as thyristor $T_h$ or a transistor in the same place can be kept in the conducting state for a sufficiently long period of time by a suitable control signal.

The control at field frequency of the diode modulator is obtained by shifting instant $t_1$ relative to the retrace period. After this instant energy is withdrawn from the circuit in which coil $L'$ is active, which circuit mainly consists of components $L'$, $L_1$, $C'_r$ and $C'_t$, so that the energy remaining in said circuit decreases and that in an increasing manner in proportion as instant $t_1$ in FIG. 2 is shifted more to the centre of the retrace period. From FIG. 2c it appears that the amplitude of the waveform decreases if instant $t_1$ is advanced to an instant $t'_1$. There is no sense in a further advance of instant $t_1$ before the centre of the retrace period as said circuit has then lost substantially all its energy, which implies that the maximum energy the circuit of FIG. 1 can supply is applied to the deflection coil. Whilst the amplitude of the flyback pulse of FIG. 2a remains constant, of course on the condition that the supply voltage of source B is constant, the amplitude of the retrace pulse present at the junction of diodes D and D' decreases and, consequently, the amplitude of the retrace pulse present across diode D increases in proportion as instant $t_1$ is shifted to the left. The adjustment of the instant at which turn-on of thyristor Th takes place at the earliest is, consequently, the adjustment of the amplitude of the line deflection, i.e. the adjustment of the width of the display picture.

Because the retrace pulse has a substantially sinusoidal variation the relation between the shift of the turn-on instant of thyristor $T_h$ and the line amplitude is not linear. A strong feedback is, consequently, necessary. As the average value of the voltage at the junction of diodes D and D' is a measure of the trace voltage across coil $L'$, this value can be used for this purpose. It is obtained by means of an integrating network consisting of a resistor R and a capacitor C and is applied to comparison stage CP in which it is compared in known manner with the parabolic signal generated by waveform generator G. By means of a winding $L_4$ of transformer T pulse generator PG is supplied with retrace pulses which serve as time reference for determining the instant $t_1$ as a function of the signal of field frequency.

FIG. 2d shows the variation of the thyristor current in the case thyristor $T_h$ is turned on at instant $t'_1$. Because the maximum amplitude of the pulse of FIG. 2c is smaller than for the case instant $t'_1$ occurs later, the maximum value of the current is not of necessity higher. If the current through coil $L'$ reverses at an instant $t_4$ during the first half of the trace period this current can then flow through the thyristor which is then in the conducting state. This is indicated in FIG. 2 in the case of FIG. 2d. The variation of the thyristor current from instant $t_4$ onwards is determined by the tuning of the circuit formed by elements $L'$, $C'_t$ and $L_3$. The voltage at the cathode of diode D' which was approximately $-0.7$ V before instant $t_4$ now becomes positive, i.e. approximately 0.5 V. Consequently the voltage across coils $L_3$ reverses so that the thyristor current initially increases. When the current through circuit $L'$, $C'_t$ $L_3$ becomes zero, the thyristor current decreases in a sawtooth manner with the same slope as in FIG. 2b and becomes zero at an instant $t'_3$, which is later than in the case the current through coil $L'$ does not reverse, whilst diode D' carries current again. Because the variation in the voltage at the junction of diodes D and D' is only slight substantially no linearity error of the deflecton current occurs. In the second half of the trace period, i.e. after the deflection current has reversed direction, this current flows through transistor Tr whilst one of the diodes conduct. This is described in the above-mentioned United States patent specification.

In the preceding it was assumed that the amplitude of the pulse of FIG. 2a is constant so that the d.c. voltages generated by the circuit, for example the voltage available across capacitor $C_1$, are also constant. Because the duration of the pulse varies somewhat this assumption is not entirely correct. However, it appeared in practice that the variation in the duration of the retrace period is too small to cause a disturbing variation in the d.c. voltages. It will be noted that the pulses of FIGS. 2a and 2c are not of exactly the same duration so that it is necessary to deviate from the known tuning condition for the sawtooth networks. This is caused by the fact that the circuit in which coil $L'$ is operative cannot complete its natural oscillations as, prior to that, capacitor $C'_r$ is quickly discharged owing to the action of thyristor $T_h$. It was found that a small detuning relative to the circuit in which coil $L_y$ is operative is desired for said circuit and that in such a way that the circuit has a somewhat longer natural resonance period. Consequently, the pulse of FIG. 2c attains its maximum value at a later instant than that of FIG. 2a and would become zero after the end of the retrace period of the deflection current if thyristor $T_h$ were not turned on. This implies that the capacitance of capacitor $C'_r$ is somewhat smaller than in the case the tuning frequencies are equal. It should be noted that capacitor $C'_r$ is not in parallel with coil $L'$ but that it is connected to a tap of transformer T.

In FIG. 1 the switch according to the invention is disposed in a circuit known from the above-mentioned U.S. Patent. Since the circuit of FIG. 1 is one of the variants described in this patent specification, which variants can be derived from one another in a simple manner, it is clear that the measure according to the invention can also be used with the other variants. It can also be applied with diode modulators of another type. By way of example FIG. 3 shows the diode modulator which is from the above-mentioned Philips Appliccation Note 206. Herein the modulator is not connected to the primary winding $L_1$ of transformer T, as is the case in FIG. 1, but to a secondary winding $L_5$ thereof. $R_L$ is a load, that is to say in practice the load formed by a supply circuit for other sections of the television receiver. The voltage thereacross is smoothed by a capacitor $C_L$. The remaining elements of FIG. 3 have been given the same reference symbols as in FIG. 1. As in FIG. 1 switch $T_h$ is connected in FIG. 3, possibly via inductance $L_3$, to the junction of diodes D and D' whereas it is controlled in the same manner as in FIG. 1. Due to the measure according to the invention the energy dissipated in FIG. 3 in load $R_L$ can be limited as thyristor $T_h$ provides a path for the current which should otherwise have to flow through diode D', which diode would be kept in the conducting state by the current flowing through load $R_L$.

It will be noted that the additional portion of the circuit according to the invention, compared with the known circuit and formed by stages CP and PG can be advantageously integrated in the same semiconductor body as generator G. In this way it hardly contributes towards the price of the circuit.

What is claimed is:

1. A circuit for generating a sawtooth line deflection current having a trace period and a retrace period through a line deflection coil and at least one direct current voltage, said circuit comprising a controllable switch which is cutoff during the retrace period, and a diode modulator means coupled to said controllable switch for influencing the amplitude of the generated deflection current during the trace period as a function of a modulation signal without influencing the d.c. voltage, generated by the circuit said diode modulator comprising a first diode adapted to cooperate with the deflection coil, a modulator coil adapted to be coupled to said deflection coil, a second diode coupled to said modulator coil, and a controllable switching device conductive in a first portion of the trace period of the deflection current coupled in parallel with the second diode with the opposite direction of conduction thereto.

2. A circuit as claimed in claim 1, wherein the controllable switching device conducts from a switching-on instant located between the central instant of the retrace period of the deflection current and the final instant thereof, which switching instant is adjustable as a function of the modulation signal.

3. A circuit as claimed in claim 1, wherein the controllable switching device comprises a series arrangement of an inductance and a switch.

4. A circuit as claimed in claim 1, wherein the controllable switching device comprises a thyristor.

5. A circuit as claimed in claim 2, further comprising a comparison stage means for comparing the modulation signal to the trace voltage across the modulator coil, and a pulse generator means for converting the output signal of the comparison stage to trigger pulses to switch on the controllable switching device.

6. A circuit as claimed in claim 5, wherein line flyback pulses are applied to the pulse generator.

7. A circuit as claimed in claim 1, wherein the flyback period of the current flowing through the modulator coil is of a longer duration, the controllable switching device being cut off, than the retrace period of the deflection current.

* * * * *